United States Patent
Park et al.

(10) Patent No.: US 12,489,431 B2
(45) Date of Patent: Dec. 2, 2025

(54) TEST APPARATUS AND TEST METHOD FOR DETECTING DEFECTS OF ELEMENTS INCLUDED IN INTEGRATED CIRCUIT

(71) Applicant: SAMSUNG ELECTRONICS CO., LTD., Suwon-si (KR)

(72) Inventors: Seonghoon Park, Suwon-si (KR); Hyoun Soo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/602,670

(22) Filed: Mar. 12, 2024

(65) Prior Publication Data
US 2025/0062752 A1   Feb. 20, 2025

(30) Foreign Application Priority Data

Aug. 16, 2023 (KR) .................. 10-2023-0107239
Sep. 1, 2023 (KR) .................. 10-2023-0116529

(51) Int. Cl.
| | | |
|---|---|---|
| G01R 31/3177 | (2006.01) | |
| H03K 3/012 | (2006.01) | |
| H03K 3/037 | (2006.01) | |
| H03K 19/173 | (2006.01) | |

(52) U.S. Cl.
CPC ......... *H03K 3/037* (2013.01); *G01R 31/3177* (2013.01); *H03K 3/012* (2013.01); *H03K 19/1737* (2013.01)

(58) Field of Classification Search
CPC .... H03K 3/012; H03K 3/037; H03K 19/1737; G01R 31/3177
See application file for complete search history.

(56) References Cited

U.S. PATENT DOCUMENTS

| | | | |
|---|---|---|---|
| 6,314,539 B1 | 11/2001 | Jacobson et al. | |
| 6,941,496 B2 | 9/2005 | Kim | |
| 7,495,254 B2 | 2/2009 | Fales et al. | |
| 7,502,980 B2 * | 3/2009 | Watanabe | H04B 17/21 |
| | | | 714/738 |
| 8,549,149 B2 | 10/2013 | Sundarrajan et al. | |
| 9,465,073 B2 | 10/2016 | Kim | |
| 10,026,661 B2 | 7/2018 | Won et al. | |

(Continued)

FOREIGN PATENT DOCUMENTS

| | | |
|---|---|---|
| JP | 2008-145204 | 6/2008 |
| JP | 2010-266417 | 11/2010 |

(Continued)

*Primary Examiner* — Patrick O Neill
(74) *Attorney, Agent, or Firm* — Fish & Richardson P.C.

(57) ABSTRACT

A test apparatus includes an input terminal, a first multiplexer, a plurality of first elements connected in series between the input terminal and the first multiplexer, and a processor. The first multiplexer is connected to each of a plurality of nodes between the plurality of first elements, and the processor is connected to the input terminal and to the first multiplexer. The processor inputs data to the plurality of first elements through the input terminal. The plurality of first elements outputs at least a portion of a plurality of pieces of data through the plurality of nodes between the elements to the first multiplexer. The processor may thereby determine whether a defect has occurred in any of the plurality of first elements by comparing data, output from the multiplexer, with an expected output value.

20 Claims, 8 Drawing Sheets

(56) References Cited

U.S. PATENT DOCUMENTS

| | | | |
|---|---|---|---|
| 10,684,326 | B2 | 6/2020 | Clerc et al. |
| 11,680,983 | B1 * | 6/2023 | Jarrar ............... G01R 31/31725 |
| | | | 714/734 |
| 2010/0293424 | A1 | 11/2010 | Katagi et al. |
| 2014/0201582 | A1 | 7/2014 | Miki |

FOREIGN PATENT DOCUMENTS

| | | |
|---|---|---|
| JP | 4711353 | 6/2011 |
| JP | 2014-137292 | 7/2014 |
| KR | 10-1997-0022341 | 5/1997 |
| KR | 10-0374645 | 3/2003 |
| KR | 10-0697264 | 3/2007 |
| KR | 10-1314893 | 10/2013 |
| KR | 10-1653508 | 9/2016 |
| KR | 10-2066661 | 1/2020 |
| KR | 10-2423878 | 7/2022 |

* cited by examiner

[FIG. 1]
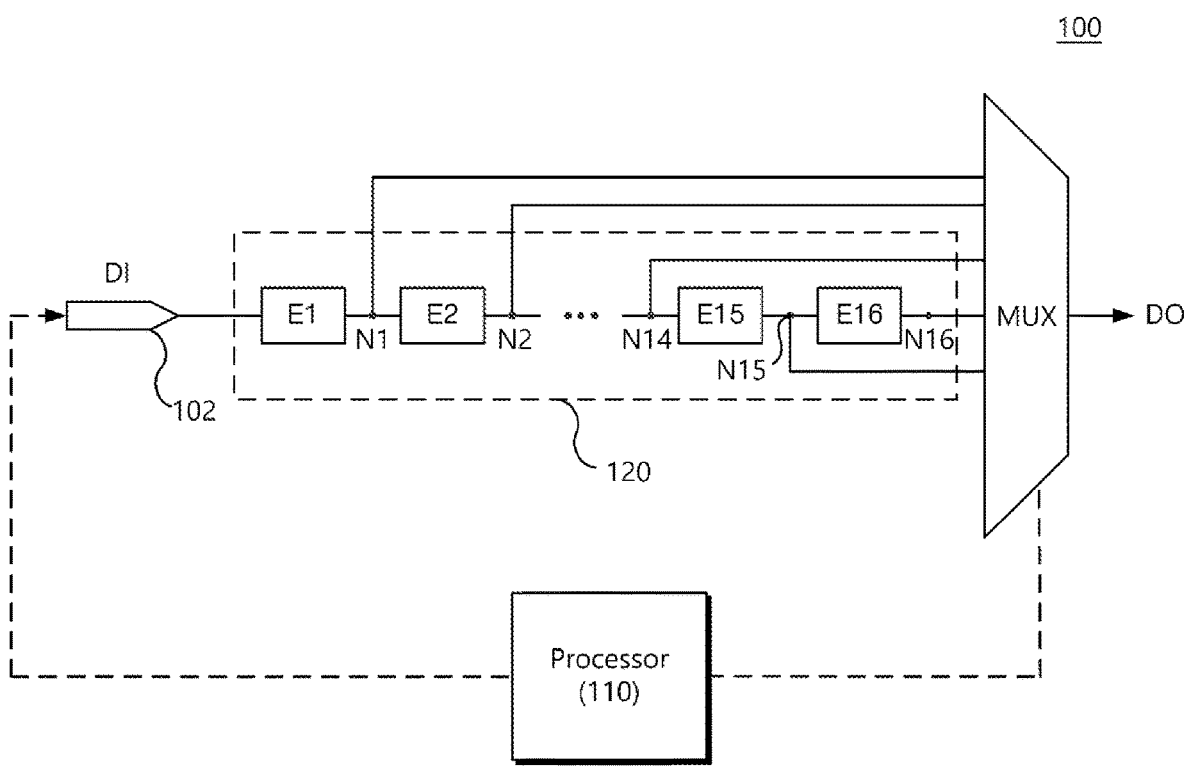

【FIG. 2a】
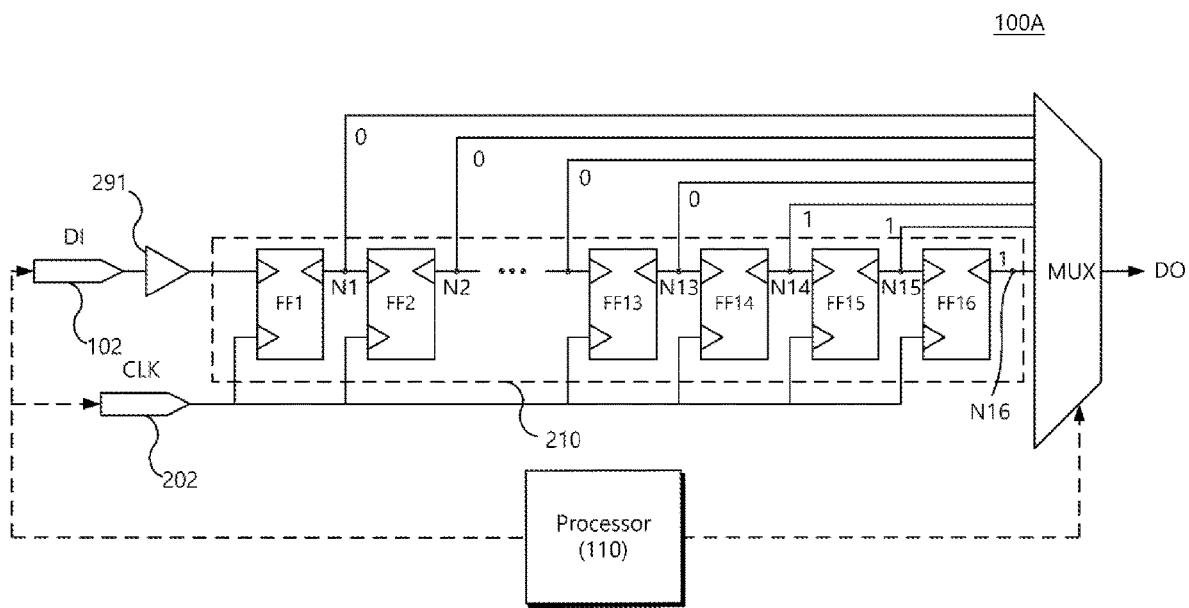

[FIG. 2b]
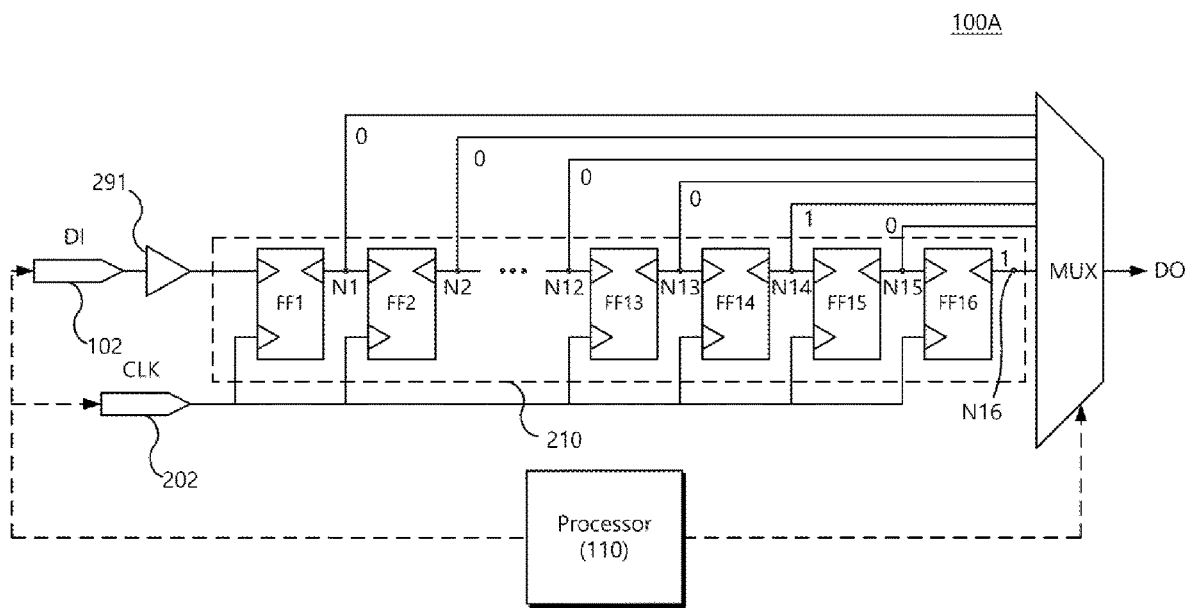

[FIG. 3]
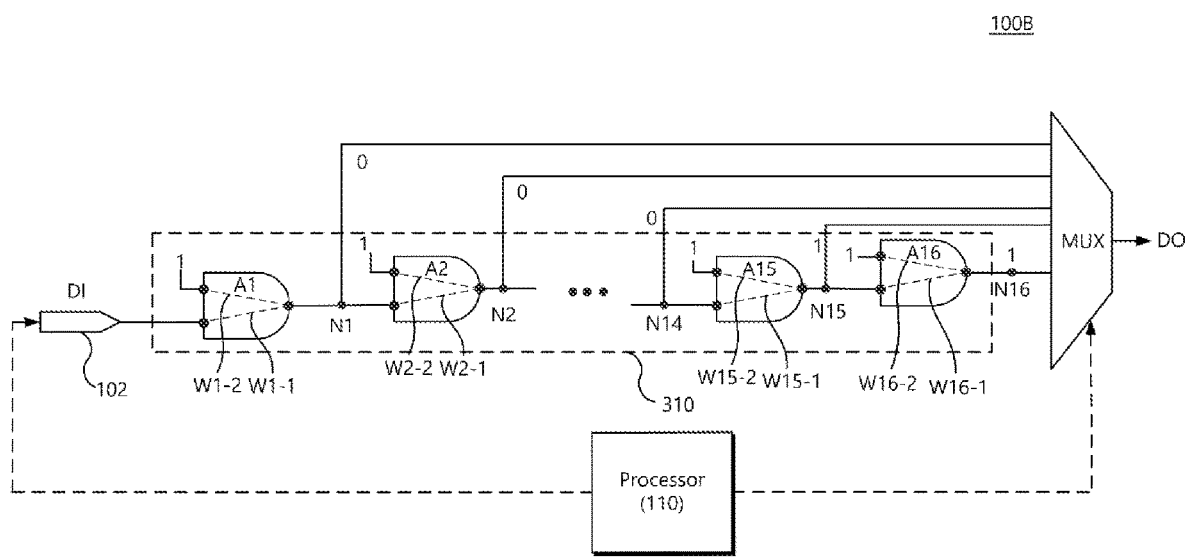

[FIG. 4]
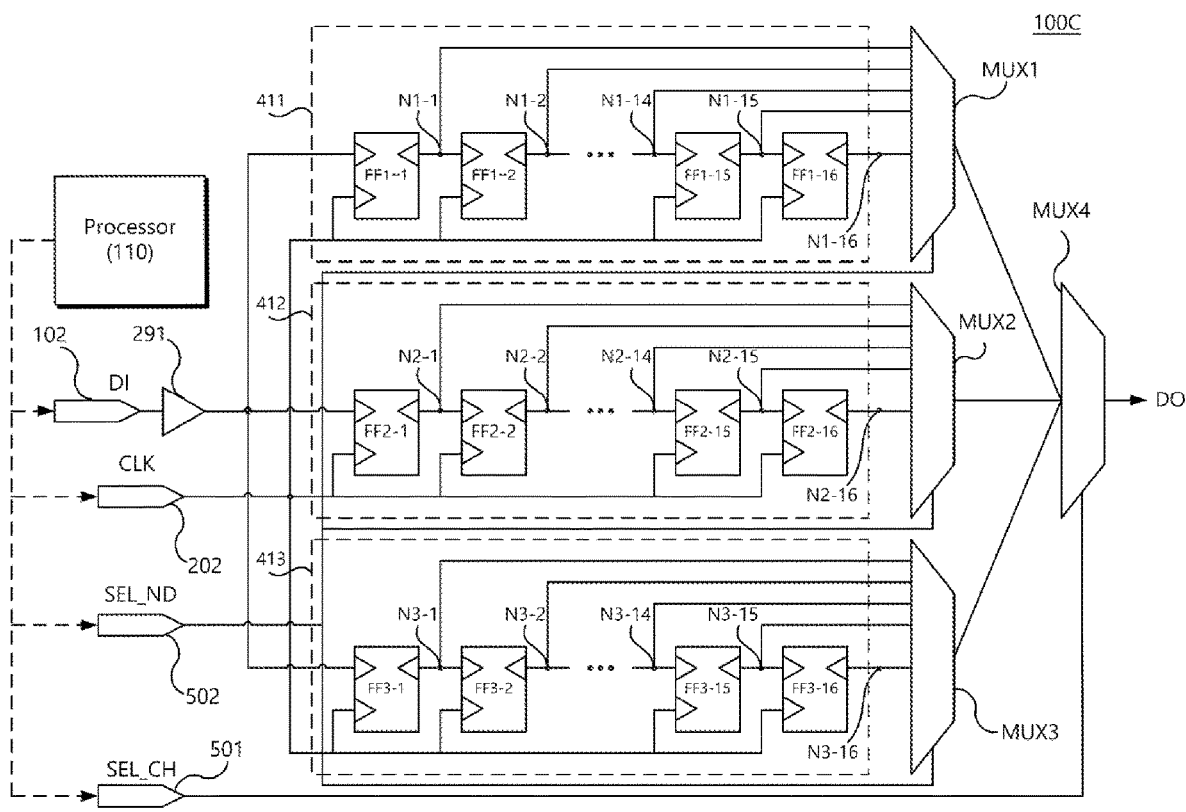

[FIG. 5]
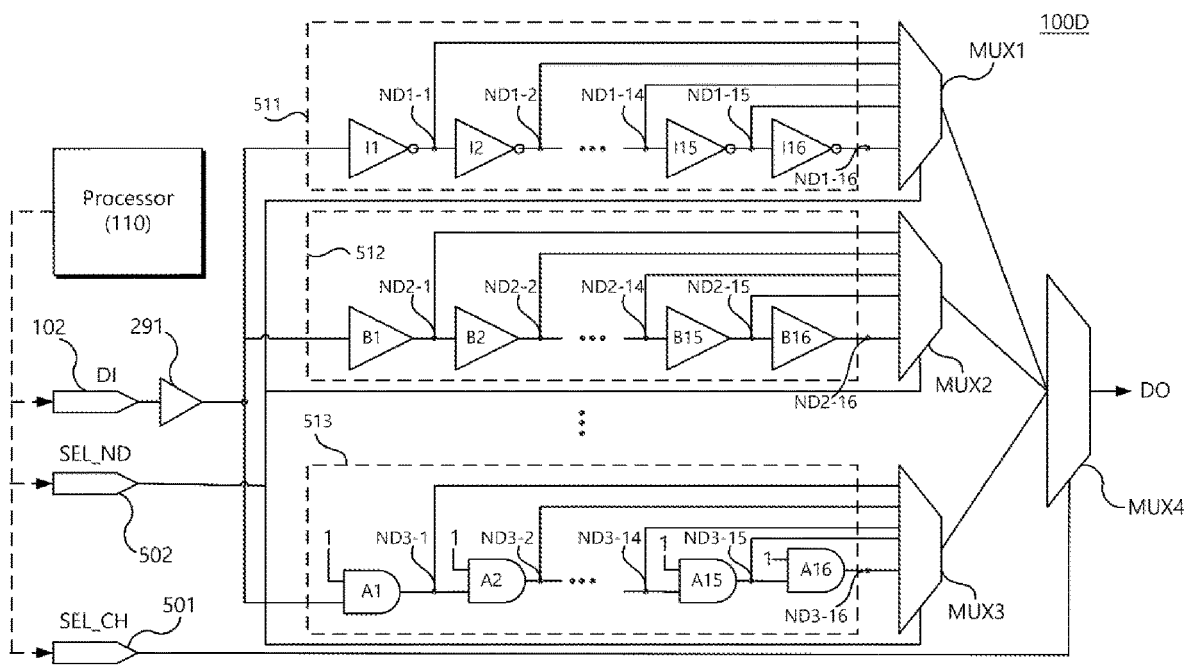

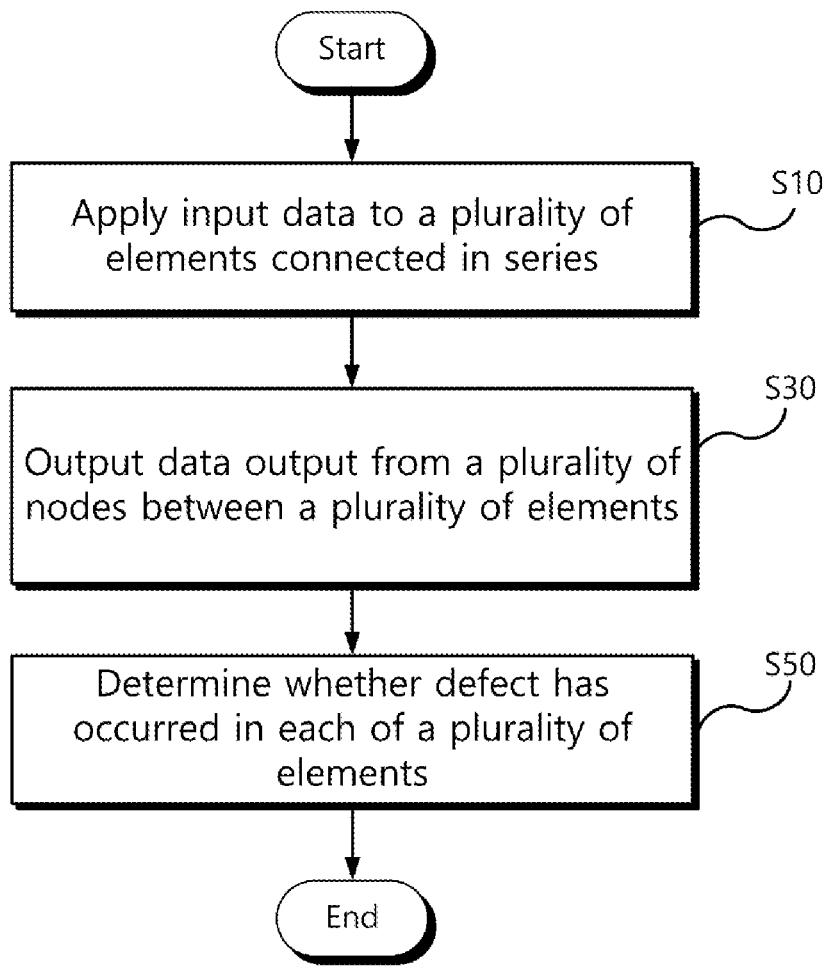

[FIG. 7]
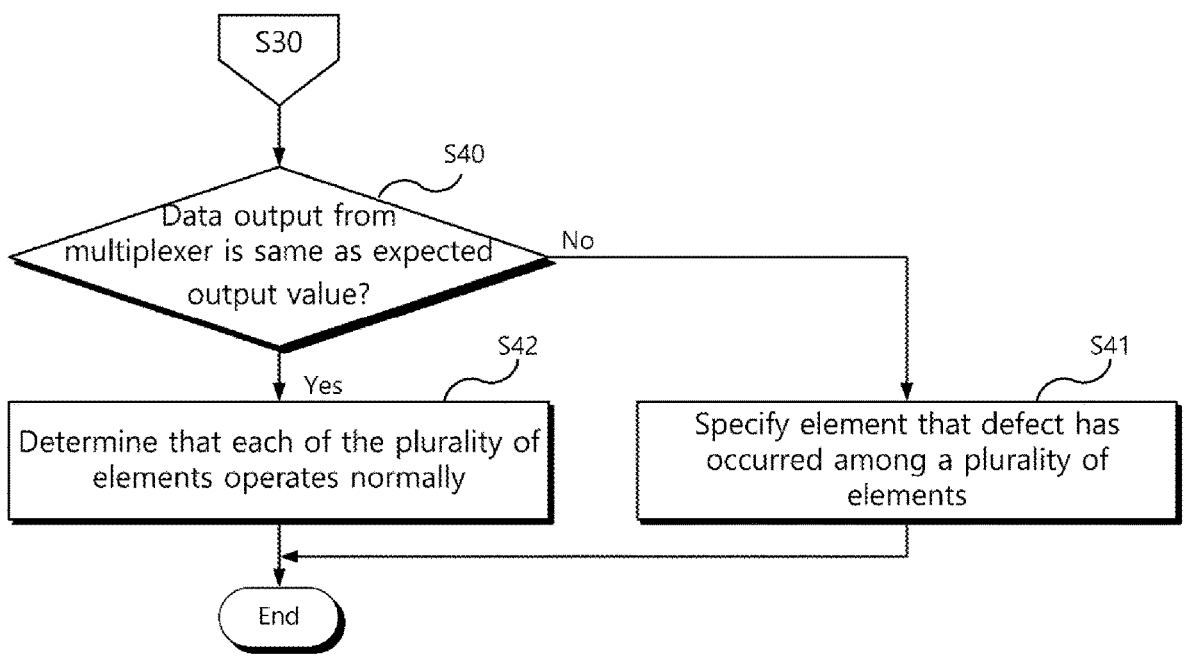

TEST APPARATUS AND TEST METHOD FOR DETECTING DEFECTS OF ELEMENTS INCLUDED IN INTEGRATED CIRCUIT

CROSS-REFERENCE TO RELATED APPLICATION(S)

This U.S. non-provisional application claims priority under 35 USC § 119 to Korean Patent Application Nos. 10-2023-0107239, filed on Aug. 16, 2023 and 10-2023-0116529, filed on Sep. 1, 2023, in the Korean Intellectual Property Office, the disclosures of which are herein incorporated by reference in their entirety.

BACKGROUND

As the integration of integrated circuits increases, a large amount of time is required to test the integrated circuits. Design technology for testing has been widely used to maintain quality of the integrated circuits and to improve test efficiency.

For example, various designs for testability (DFT) circuits have been developed to test integrated circuits, and a methods using scan testing has been widely used. Scan testing is a method of testing a plurality of scan flip-flops by connecting the scan flip-flops in series to constitute a scan chain.

However, testing integrated circuits using a scan chain may have difficulty in performing accurate testing in the initial stage of a process in which a certain level of yield is not secured.

SUMMARY

Example implementations relate to test apparatuses and test methods for identifying an element in which a defect has occurred, among a plurality of elements of an integrated circuit. The identification may be based on data output from the plurality of elements as input data is provided to the plurality of elements.

According to an example implementation, a test apparatus includes an input terminal, a first multiplexer, a plurality of first elements connected in series between the input terminal and the first multiplexer, the first multiplexer being connected to each of a plurality of nodes between the plurality of first elements, and a processor connected to the input terminal and the first multiplexer. The process may be configured to provide input data to the plurality of first elements through an input terminal, to output at least a portion of a plurality of pieces of data through the plurality of nodes as the input data is provided, to the plurality of first elements through the first multiplexer, and to determine whether a defect has occurred in each of the plurality of first elements by comparing data, output from the multiplexer, with a predetermined expected output value.

According to an example implementation, a test method of detecting defects of elements in an integrated circuit includes inputting input data to a plurality of elements, connected in series in the integrated circuit, through an input terminal, outputting at least a portion of a plurality of pieces of data, output from a plurality of nodes between the plurality of elements as the input data is input, to the plurality of elements, and determining whether a defect has occurred in each of the plurality of elements, by comparing data, output from the multiplexer, with a predetermined expected output value. The multiplexer may be connected to the plurality of nodes between the plurality of elements.

According to an example implementation, a system-on-chip includes an integrated circuit comprising a plurality of elements connected in series, an input terminal having one end connected to the plurality of elements, a multiplexer having the other end connected to the plurality of elements and connected to a plurality of nodes between the plurality of elements, and a processor connected to the input terminal and the multiplexer. The processor may be configured to provide input data to the plurality of elements through the input terminal, to output at least a portion of a plurality of pieces of data through the plurality of nodes as the input data is provided, to the plurality of elements through the multiplexer, and to determine whether a defect has occurred in each of the plurality of elements by comparing data, output from the multiplexer, with a predetermined expected output value.

BRIEF DESCRIPTION OF THE DRAWINGS

The above and other aspects, features, and advantages of the present disclosure will be more clearly understood from the following detailed description, taken in conjunction with the accompanying drawings.

FIG. 1 is a diagram illustrating an example test apparatus.

FIG. 2A is a circuit diagram illustrating an example test apparatus.

FIG. 2B is a circuit diagram illustrating a state in which a defect has occurred in at least a portion of elements included in the test apparatus of FIG. 2A.

FIG. 3 is a circuit diagram of an example test apparatus.

FIG. 4 is a circuit diagram illustrating an example test apparatus including a plurality of elements connected in series between different multiplexers and an input terminal.

FIG. 5 is a circuit diagram illustrating an example test apparatus in which a plurality of different elements are connected in series.

FIG. 6 is a flowchart illustrating an example test method of determining whether each of a plurality of devices is defective.

FIG. 7 is a flowchart illustrating an example operation of comparing output data and an expected output value to identify an element in which a defect has occurred.

DETAILED DESCRIPTION

Hereinafter, example implementations will be described with reference to the accompanying drawings.

FIG. 1 is a diagram illustrating an example test apparatus.

Referring to FIG. 1, an example test apparatus 100 may include an input terminal 102, a multiplexer MUX, a plurality of elements 120, and a processor 110.

According to an example implementation, the test apparatus 100 may include a plurality of elements 120 connected in series. For example, the test apparatus 100 may include a plurality of elements 120 connected in series between the input terminal 102 and the multiplexer MUX.

For example, the test apparatus 100 may include a plurality of elements 120 including a total of 16 elements E1 to E16 connected in series between the input terminal 102 and the multiplexer MUX. Alternatively, the test apparatus 100 may include a plurality of elements 120 including a total of eight elements connected in series.

However, the number of elements included in the plurality of elements 120 is not limited to the above description and the example illustrated in FIG. 1.

The plurality of elements 120 may be referred to as elements disposed on an integrated circuit.

For example, each of the plurality of elements 120 may be referred to as a flip-flop disposed on an integrated circuit.

Alternatively, each of the plurality of elements 120 may be referred to as a logic element (for example, an AND gate, a buffer, or an inverter) disposed on an integrated circuit. In this case, each of the plurality of devices 120 may be named a standard cell.

However, the type of each of the plurality of elements 120 is not limited to the above-described example and may be understood to include various types of elements that may be disposed on an integrated circuit.

The test apparatus 100 may include an input terminal 102 connected to one end of the plurality of elements 120. For example, the test apparatus 100 may include an input terminal 102 connected to a first element E1 disposed at one end of a plurality of elements 120 connected in series.

The test apparatus 100 may include the multiplexer MUX connected to the other end of the plurality of elements 120. For example, the test apparatus 100 may include a multiplexer MUX connected to the sixteenth element E16 disposed at the other end of the plurality of elements 120 connected in series.

The multiplexer MUX may be connected to the plurality of elements 120 through a plurality of nodes N1 to N16. For example, the multiplexer MUX may be connected to the plurality of nodes N1 to N16 between the plurality of elements 120. Accordingly, for example, the multiplexer MUX may be understood as having a 16×1 structure, but example implementations are not limited thereto.

According to an example implementation, the test apparatus 100 may include the processor 110 connected to the input terminal 102 and the multiplexer MUX.

For example, the processor 110 may execute software (or a program) to control at least one component (for example, the input terminal 102 and/or the multiplexer MUX), among other components of the test apparatus 100, and may perform a variety of data processing or operations. The processor 110 may include a central processing unit, a microprocessor, or the like, and may control the overall operation of the test apparatus 100. Accordingly, operations performed by the test apparatus 100 below may be understood as being performed under the control of the processor 110.

According to an example implementation, the processor 110 may include an algorithm for controlling at least a portion of the input terminal 102 and the multiplexer MUX. For example, the algorithm may be a software code programmed in the processor 110. Alternatively, the algorithm may be hard-coded in the processor 110, but example implementations are not limited thereto.

The processor 110 may determine whether a defect has occurred in each of the plurality of elements 120, based on an algorithm.

The processor 110 may input input data DI to the plurality of elements 120 through the input terminal 102.

For example, the processor 110 may input predetermined input data DI (for example, "0") to the plurality of elements 120 through the input terminal 102 connected to the first element E1.

The processor 110 may control the multiplexer MUX to output data, output from the plurality of elements 120 through the plurality of nodes N1 to N16 as the input data DI is input, as output data DO.

For example, the processor 110 may input the input data DI to the plurality of elements 120 through the input terminal 102 and may then output at least a portion of pieces of data, output through the plurality of nodes N1 to N16, as the output data DO through the multiplexer MUX.

For example, the processor 110 may output first data, output from the first element E1 through the first node N1 as the input data DI is input, as the output data DO through the multiplexer MUX.

According to an example implementation, the processor 110 may output at least a portion of pieces of data, output through the plurality of nodes N1 to N16, through the multiplexer MUX after a predetermined time has elapsed since the input data DI was input to the plurality of elements 120 through the input terminal 102.

The processor 110 may compare the output data DO, output through the multiplexer MUX, with a predetermined expected output value. Furthermore, the processor 110 may determine whether a defect has occurred in each of the plurality of devices 120, based on a result of the comparison.

For example, the processor 110 may compare the first data, output through the first node N1 between the first element E1 and the second element E1, with the first expected output value. For example, when the first data is different from the first expected output value, the processor 110 may determine that a defect has occurred in the first element E1.

For example, when the first data is equal to the first expected output value, the processor 110 may determine that a defect has not occurred in the first element E1. In addition, for example, when the first data is equal to the first expected output value, the processor 110 may determine that the first element E1 is operating normally.

Referring to the above-described configurations, the processor 110 may compare data, output through the plurality of nodes N1 to N16 between the plurality of elements 120, with a predetermined expected output value to determines whether a defect has occurred in each element.

Accordingly, the test apparatus 100 according to example implementations may reduce the time consumed to identify an element in which a defect has occurred, among the plurality of elements 120 included in the integrated circuit.

FIG. 2A is a circuit diagram illustrating an example test apparatus, and FIG. 2B is a circuit diagram illustrating a state in which a defect has occurred in at least a portion of elements included in the test apparatus of FIG. 2A.

Referring to FIGS. 2A and 2B, an example test apparatus 100A may determine whether a defect has occurred in each of a plurality of elements 210 implemented as flip-flops.

The test apparatus 100A of FIGS. 2A and 2B may be understood as an example of the test apparatus 100 of FIG. 1. In addition, a plurality of elements 210 of FIGS. 2A and 2B may be understood as an example of the plurality of elements 120 of FIG. 1. Accordingly, the same reference numerals are used to represent the same or substantially the same elements, and redundant descriptions will be omitted below.

According to an example implementation, each of the plurality of elements 210 may be implemented as a flip-flop.

For example, the test apparatus 100A may include a plurality of devices 210 including a first flip-flop FF1 to a sixteenth flip-flop FF16 connected in series. In this case, the first flip-flop FF1 to the sixteenth flip-flop FF16 may be understood as corresponding to the first to sixteenth elements E1 to E16 of FIG. 1.

Alternatively, the test apparatus 100A may include a plurality of elements 210 including a first flip FF1 to an eighth flip-flop FF8 connected in series.

However, the number of flip-flops included in the plurality of elements 210 is not limited to the above-described examples.

In addition, for example, the plurality of elements 210 may be implemented as at least a portion of a JK flip-flop, a latch flip-flop, a D flip-flop, and an RS flip-flop, but example implementations are not limited thereto.

The test apparatus 100A according to an example implementation may further include a buffer 291 disposed between the input terminal 102 and the plurality of elements 210. However, the buffer 291 may be omitted in some implementations.

In addition, the test apparatus 100A may further include a clock generator 202 connected to each of the plurality of elements 210. For example, the test apparatus 100A may further include a clock generator 202 generating a clock signal CLK transmitted to each of the plurality of elements 210 implemented as flip-flops.

According to an example implementation, the processor 110 may input a clock signal CLK to each of the plurality of elements 210, implemented as flip-flops, through the clock generator 202.

For example, the processor 110 may provide input data DI to the plurality of elements 210 through an input terminal 102, and may then input a clock signal CLK, generated by the clock generator 202, to each of the plurality of elements 210.

For example, the processor 110 may input the input data DI to the plurality of elements 210 through the input terminal 102, and may then input a clock signal CLK, generated by the clock generator 202, to the plurality of elements 210 for a predetermined time.

In this case, the predetermined time may be understood as a time including a number of periods corresponding to the number of flip-flops constituting the plurality of elements 210.

For example, the predetermined time may be understood as a time between a time point, at which the input data DI is input, and a time point at which the data output from the sixteenth flip-flop FF16 is transmitted to a multiplexer MUX.

Each of the plurality of elements 210 implemented as flip-flops may output data, transmitted through an input port, through an output port in response to the clock signal CLK being input.

For example, the second flip-flop FF2 may output data, transmitted from the first flip-flop FF1, to the third flip-flop FF3 in response to the clock signal CLK being input.

In this case, a plurality of pieces of data, output from flip-flops in response to the clock signal CLK being input, may be transmitted to the multiplexer MUX through a plurality of nodes N1 to N16 between the plurality of elements 210.

For example, data output from each flip-flop may be transmitted from the plurality of elements 210 to the multiplexer MUX through the plurality of nodes N1 to N16.

For example, the first data output from the first flip-flop FF1 may be transmitted to the multiplexer MUX through the first node N1 in response to the clock signal CLK being input. In addition, for example, fourteenth data output from the fourteenth flip-flop FF14 may be transmitted to the multiplexer MUX through the fourteenth node N14 in response to the clock signal CLK being input.

The processor 110 may control the multiplexer MUX to output at least a portion of a plurality of pieces of data transmitted to the multiplexer MUX through the plurality of nodes N1 to N16.

For example, the processor 110 may transmit a control signal (or a select signal) to the multiplexer MUX to output at least a portion of a plurality of pieces of data, transmitted to the multiplexer MUX through the plurality of nodes N1 to N16, as output data DO.

For example, the processor 110 may control the multiplexer MUX to sequentially output the plurality of pieces of data transmitted to the multiplexer MUX through the plurality of nodes N1 to N16.

For example, the processor 110 may control the multiplexer MUX to output a portion of the plurality of pieces of data transmitted to the multiplexer MUX through a plurality of nodes N1 to N16.

The processor 110 may compare the output data DO, output from the multiplexer MUX, with a predetermined expected output value.

For example, when output data DO such as "0000000000000111" is output through the multiplexer MUX, the processor 110 may compare the output data DO with "0000000000000000", a predetermined expected output value.

For example, when output data DO such as "1" is output from the thirteenth node N13 through the multiplexer MUX, the processor 110 may compare the output data DO with "0," a predetermined predicted output value for the thirteenth node N13.

When at least a portion of the plurality of pieces of data, output from the plurality of elements 210 as the input data DI is input, is different from the expected output value, the processor 110 may determine that a defect has occurred in an element outputting data, different from the expected output value.

For example, when the expected output value of the fourteenth flip-flop FF14 is "0" and "1" is output through the fourteenth node N14, the processor 110 may determine that a defect has occurred in the fourteenth flip-flop FF14.

According to an example implementation, when each piece of the data output from the at least two continuous elements is different from the expected output value, the processor 110 may determine that a defect has occurred in at least a portion of the continuous elements.

For example, when an expected output value for the fourteenth flip-flop FF14 to the sixteenth flip-flop FF16 is "0" and "1" is output through the fourteenth node N14 to the sixteenth node N16, the processor 110 may determine that a defect has occurred in the fourteenth flip-flop FF14, the fifteenth flip-flop FF15, and the sixteenth flip-flop FF16.

According to an example implementation, when each piece of the data output from the at least two continuous elements is different from the expected output value, the processor 110 may determine that a defect has occurred in an element adjacent to the input terminal 102, among the at least two continuous elements.

For example, when an expected output value for the fourteenth flip-flop FF14 to the sixteenth flip-flop FF16 is "0" and "1" is output through the fourteenth node N14 to the sixteenth node N16, the processor 110 may determine that a defect has occurred in the fourteenth flip-flop FF14.

Referring to FIG. 2B according to an example implementation, when each piece of data output from at least two discontinuous elements is different from the expected output value, the processor 220 may determine that a defect has occurred in each of the at least two discontinuous elements.

For example, when an expected output value for the fourteenth flip-flop FF14 and the sixteenth flip-flop FF16 is "0" and "1" is output through the fourteenth node N14 and the sixteenth node N16, the processor 110 may determine that a defect has occurred in the fourteenth flip-flop FF14 and the sixteenth flip-flop FF16.

Referring to the above-described configurations, the processor 110 may determine that a defect has occurred in each of the plurality of elements 210, based on the data output through a plurality of nodes, as the input data DI is input to the plurality of elements 210.

Accordingly, the test apparatus 100A may reduce the time consumed to identify an element in which a defect has occurred, among the plurality of elements 210 included in the integrated circuit.

FIG. 3 is a circuit diagram illustrating an example test apparatus.

Referring to FIG. 3, a test apparatus 100B according to an example implementation may determine whether a defect has occurred in each of a plurality of elements 310 including logic elements (or standard cells).

The test apparatus 100B of FIG. 3 may be understood as an example of the test apparatus 100 of FIG. 1. In addition, the plurality of elements 310 of FIG. 3 may be understood as an example of the plurality of elements 120 of FIG. 1. Accordingly, the same reference numerals are used to represent the same or substantially the same elements, and redundant descriptions will be omitted below.

According to an example implementation, the test apparatus 100B may include a plurality of elements 310, each implemented as an AND gate.

For example, the test apparatus 100B may include a plurality of elements 310 including a first AND gate A1 to a sixteenth AND gate A16 connected in series. For another example, the test apparatus 100B may include a plurality of elements 310 including a first AND gate A1 to an eighth AND gate A8 connected in series.

However, the number of AND gates constituting the plurality of devices 310 is not limited to the above-described example.

According to an example implementation, each of the plurality of AND gates A1 to A16 may include two input ports and a single output port.

Furthermore, each of the AND gates A1 to A16 constituting the plurality of devices 310 may include at least two internal paths.

For example, each of the plurality of AND gates A1 to A16 may include at least two internal paths connecting each of the two input ports and the output port.

For example, the first AND gate A1 may include a 1-1-th internal path W1-1 and a 1-2-th internal path W1-2 connecting input ports and an output port. For example, the second AND gate A2 may include a 2-1-th internal path W2-1 and a 2-2-th internal path W2-2 connecting input ports and an output port.

According to an example implementation, the plurality of AND gates A1 to A16 may be connected in series.

For example, the plurality of AND gates A1 to A16 may be connected in series through corresponding internal paths, among a plurality of internal paths included in each of the plurality of AND gates A1 to A16.

The plurality of AND gates A1 to A16 may be connected in series through corresponding paths, among two internal paths included in each of the plurality of AND gates A1 to A16.

For example, the first AND gate A1 to the sixteenth AND gate A16 may be connected in series to each other through a 1-1-th internal path W1-1 to the 16-1-th internal path W16-1. For example, the second AND gate A2 may be connected in series to the input terminal 102 through the 1-1-th internal path W1-1 of the first AND gate A1. For example, the fifteenth AND gate A15 may be connected in series to the multiplexer MUX through a 16-1-th internal path W16-1 of the sixteenth AND gate A16.

Accordingly, input data DI input through the input terminal 102 may be transmitted to a multiplexer MUX through electrical paths connected in series through the 1-1-th internal path W1-1 to the 16-1-th internal path W16-1.

The processor 110 may input the input data DI to the plurality of elements 310 through the input terminal 102. For example, the processor 110 may input "0" to the plurality of elements 310 through the input terminal 102.

In addition, the processor 110 may input a predetermined reference value (for example, "1") to each of the plurality of elements 310 through an input port, other than a port connected to the input terminal 102, among a plurality of input ports included in each of the plurality of elements 310.

For example, the processor 110 may input "0" through the input terminal 102 to the plurality of elements 310 and may input "1" to each of the plurality of elements 310 through a port that is not connected to the input terminal 102. In this case, an expected output value expected to be output from each of the plurality of elements 310 may be set to "0."

The processor 110 may control the multiplexer MUX to select a portion of the plurality of pieces of data, output through the plurality of nodes N1 to N16, as the input data DI and a reference value are input to the plurality of elements 310.

The processor 110 may compare the output data DO, output through the multiplexer MUX, with the expected output value to determine whether a defect has occurred in each of the plurality of elements 310.

For example, when "1" is output from the fifteenth node N15 in a state in which the expected output value set for each of the plurality of elements 310 is "0," the processor 110 may determine that a defect has occurred in the fifteenth AND gate A15.

The processor 110 may compare the data, output through the multiplexer MUX, with the predetermined expected output value to determine whether a defect has occurred in an internal path included in each of the plurality of elements 310.

For example, the fifteenth AND gate A15 may output data, different from the expected output value, in a state in which the first AND gate A1 to the sixteenth AND gate A16 are connected in series through the 1-1-th internal path W1-1 to the 16-1-th internal path W16-1.

In addition, the fifteenth AND gate A15 may output the same data as the expected output value in a state in which the first AND gate A1 to the sixteenth AND gate A16 are connected in series through a 1-2-th internal path W1-2 to a 16-2-th internal path W16-2.

In this case, the processor 110 may determine that a defect has occurred in the 15-1-th internal path W15-1 of the fifteenth AND gate A15.

Referring to the above-described configurations, the processor 110 may determine whether a defect has occurred in each of the plurality of elements 310, based on the data output through a plurality of nodes, as the input data DI is input to the plurality of elements 310.

In addition, the processor 110 may determine whether a defect has occurred in an internal path included in each of the plurality of elements 310, based on the data output through a plurality of nodes, as the input data ID is input to the plurality of elements 310.

Accordingly, the test apparatus 100B according to an example implementation may reduce the time consumed to identify an element in which a defect has occurred, among the plurality of devices 310 included in the integrated circuit.

In addition, the test apparatus 100B may reduce the time consumed to identify an internal path in which a defect has occurred, among the plurality of internal paths included in an element determined to be an element in which a defect has occurred.

FIG. 4 is a circuit diagram illustrating an example test apparatus including a plurality of elements connected in series between different multiplexers and an input terminal.

Referring to FIG. 4, the test apparatus 100C according to an implementation may include a plurality of elements 411, 412, and 413 connected in series between an input terminal 102 and different multiplexers MUX1, MUX2, and MUX3.

The test apparatus 100C illustrated in FIG. 4 may be understood as an example of the test apparatus 100 of FIG. 1. Accordingly, the same reference numerals are used to represent the same or substantially the same elements, and redundant descriptions will be omitted below.

, An example test apparatus 100C may include a first multiplexer MUX1, a second multiplexer MUX2, a third multiplexer MUX3, and an output multiplexer MUX4.

For example, the test apparatus 100C may include a first multiplexer MUX1, a second multiplexer MUX2, and a third multiplexer MUX3, respectively connected in series to a plurality of elements 411, 412, and 413. In addition, the test apparatus 100C may include an output multiplexer MUX4 connected to the first multiplexer MUX1, the second multiplexer MUX2, and the third multiplexer MUX3.

In this case, each of the first multiplexer MUX1, the second multiplexer MUX2, and the third multiplexer MUX3 may have a 16×1 structure. For example, the output multiplexer MUX4 may also have a 64×1 structure. However, a structure of each multiplexer is not limited to the above-described examples.

The test apparatus 100C may include a plurality of first elements 411 connected in series between the input terminal 102 and the first multiplexer MUX1. In addition, the test apparatus 100C may include a plurality of second elements 412 connected in series between the input terminal 102 and the second multiplexer MUX2. In addition, the test apparatus 100C may include a plurality of third elements 413 connected in series between the input terminal 102 and the third multiplexer MUX3.

The first multiplexer MUX1 may be connected to a plurality of nodes N1-1 to N1-16 between the plurality of first elements 411. The second multiplexer MUX2 may be connected to a plurality of nodes N2-1 to N2-16 between the plurality of second elements 412. The third multiplexer MUX3 may be connected to a plurality of nodes N3-1 to N3-16 between the plurality of third elements 413.

Each of the plurality of elements 411, 412, and 413 may be implemented as a flip-flop.

For example, the plurality of first elements 411 may include a 1-1-th flip-flop FF1-1 to a 1-16-th flip-flops FF1-16. The plurality of second elements 412 may include a 2-1-th flip-flops FF2-1 to a 2-16-th flip-flops FF2-16. The plurality of third elements 413 may include a 3-1-th flip-flops FF3-1 to a 3-16-th flip-flops FF3-16.

In this case, the plurality of first elements 411, the plurality of second elements 412, and the plurality of third elements 413 may each be implemented as different types of flip-flops.

For example, each of the plurality of first elements 411 may be implemented as a D flip-flop. Each of the second elements 412 may be implemented as a JK flip-flop. Each of the third elements 413 may be implemented as a latch flip-flop.

According to an example implementation, the plurality of elements 411, 412, and 413 may each be implemented as different types of flip-flops.

For example, each of the plurality of first elements 411 may be implemented as a D flip-flop or an RS flip-flop. Each of the plurality of second elements 412 may be implemented as a JK flip-flop or a latch flip-flop. Each of the plurality of third elements 413 may be implemented as a D flip-flop, a JK flip-flop, or an RS flip-flop.

However, the types and configurations of the flip-flops constituting the plurality of elements 411, 412, and 413 are not limited to the above-described examples.

Each of the plurality of elements 411, 412, and 413, connected in series between different multiplexers MUX1, MUX2, and MUX3 and the input terminal 102, may be named a flip-flop channel or a flip-flop chain, but example implementations are not limited thereto.

The processor 110 (or the test apparatus 100C) may input a clock signal CLK, generated through a clock generator 202, to each of the flip-flops which together constitute the plurality of elements 411, 412, and 413.

According to an example implementation, the test apparatus 100C may further include a first select terminal 501 and a second select terminal 502 connected to the processor 110.

For example, the test apparatus 100C may include a first select terminal 501 connected to the processor 110 and the output multiplexer MUX4.

The processor 110 may transmit the first select signal SEL_CH to the output multiplexer MUX4 through the first select terminal 501. In this case, the first select signal SEL_CH may be referred to as a control signal controlling the output multiplexer MUX4 to output data received through an input terminal, among a plurality of input terminals of the output multiplexer MUX4.

Accordingly, the processor 110 may control the output multiplexer MUX4 to output data output from one of the first multiplexer MUX1, the second multiplexer MUX2, and the third multiplexer MUX3.

For example, the processor 110 may transmit the first select signal SEL_CH to the output multiplexer MUX4 through the first select terminal 501 to output data, output from the second multiplexer MUX2, as output data DO.

In addition, the processor 110 may transmit a second select signal SEL_ND to at least a portion of the first multiplexer MUX1, the second multiplexer MUX2, and the third multiplexer MUX3 through a second select terminal 502. In this case, the second select signal SEL_ND may be referred to as a control signal controlling the first multiplexer MUX1, the second multiplexer MUX2, or the third multiplexer MUX3 to output data received through an input terminal of the controlled multiplexer.

Accordingly, the processor 110 may control the first multiplexer MUX1, the second multiplexer MUX2, or the third multiplexer MUX3 to output at least portion of a plurality of pieces of data output from a plurality of nodes connected to each of the multiplexers MUX1, MUX2, and MUX3.

For example, the processor 110 may transmit the second select signal SEL_ND to the third multiplexer MUX3 through the second select terminal 502 to output data, output from a 3-2-th node N3-2 among a plurality of nodes N3-1 to N3-16 connected to the third multiplexer MUX3, as output data DO.

The processor 110 may control the first select terminal 501 and the second select terminal 502 to output at least a portion of a plurality of pieces of data, output from the plurality of elements 411, 412, and 413 based on the input data DI, as output data DO.

According to an example implementation, the processor 110 may control the first select terminal 501 and the second select terminal 502 to sequentially output a plurality of pieces of data output from the plurality of elements 411, 412, or 413.

For example, the processor 110 may control the first multiplexer MUX1 and the output multiplexer MUX4 through the first select terminal 501 and the second select terminal 502 to sequentially output a plurality of pieces of data output by the plurality of first elements 411 (or the 1-1-th flip-flop FF1-1 to 1-16-th flip-flops FF1-16), connected in series, based on the input data DI.

For example, the processor 110 may control the multiplexers MUX1, MUX2, MUX3, and MUX4 through the first select terminal 501 and the second select terminal 502 to sequentially output a plurality of pieces of data output by the 1-1-th flip-flop FF1-1, the 2-1-th flip-flop FF2-1, and the 3-1-th flip-flop FF3-1 based on the input data DI.

According to an example implementation, the processor 110 may control the first select terminal 501 and the second select terminal 502 to output data. output from at least a portion of the plurality of elements 411, 412, or 413, as output data DO.

For example, the processor 110 may control the second multiplexer MUX2 and the output multiplexer MUX4 through the first select terminal 501 and the second select terminal 502 to respectively output a plurality of pieces of data output by the 2-1-th flip-flop FF2-1 and the 2-15-th flip-flop FF2-15 based on the input data DI.

For example, the processor 110 may control the second multiplexer MUX2, the third multiplexer MUX3, and the output multiplexer MUX4 through the first select terminal 501 and the second select terminal 502 to respectively output a plurality of pieces of data output by the 2-15-th flip-flop FF2-15 and the 3-2-th flip-flop FF3-2 based on the input data DI.

For example, the processor 110 may control at least a portion of the first multiplexer MUX1, the second multiplexer MUX2, the third multiplexer MUX3, and the output multiplexer MUX4 to output a portion of a plurality of pieces of data output from the plurality of elements 411, 412, and 413.

According to an example implementation, the processor 110 may output a plurality of pieces of data, output from a plurality of nodes, through the multiplexers MUX1, MUX2, MUX3, and MUX4 after a predetermined time has elapsed since the input data DI was input to the plurality of elements 411, 4122, and 413.

In this case, for example, the predetermined time may be understood as a time required to apply a clock signal CLK to the plurality of elements 411, 412, and 413. Therefore, for example, the predetermined time may be understood as a time including a number of periods corresponding to the number of the plurality of elements 411, 412, or 413 connected in series.

For example, the predetermined may be understood as a time between a time point, at which the input data DI is applied to the plurality of elements 411, 412, and 413, and a time point at which all pieces of data output from each of the plurality of elements 411, 412, and 413 are transmitted to the multiplexers MUX1, MUX2, MUX3, and MUX4.

Furthermore, the processor 110 may compare the output data DO, output from the output multiplexer MUX4, with a predetermined expected output value. The processor 110 may determine whether a defect has occurred in each of the plurality of devices 411, 412, and 413, based on a result of the comparison.

For example, when the expected output value set for the 2-15-th flip-flop FF2-15 is "0" and the 2-15-th flip-flop FF2-15 outputs "1," the processor 110 may determine that a defect has occurred in the 2-15-th flip-flop FF2-15.

Referring to the above-described configurations, the processor 110 may determine whether a defect has occurred in each of the plurality of elements 411, 412, and 413, based on data output through a plurality of nodes, as the input data DI is input to the plurality of elements 411, 412, and 413 connected in series in separate electrical paths.

Accordingly, the test apparatus 100C may reduce the time consumed to identify an element in which a defect has occurred, among the plurality of elements 411, 412, and 413 connected in series in separate electrical paths on an integrated circuit.

FIG. 5 is a circuit diagram illustrating an example test apparatus in which a plurality of different elements are connected in series.

Referring to FIG. 5, a test apparatus 100D according to an example implementation may include a plurality of elements 511, 512, and 513 connected in series between an input terminal 102 and different multiplexers MUX1, MUX2, and MUX3.

The test apparatus 100D illustrated in FIG. 5 may be understood as an example of the test apparatus 100 of FIG. 1. Accordingly, the same reference numerals are used to represent the same or substantially the same elements, and redundant descriptions will be omitted below.

According to an example implementation, the test apparatus 100C may include a first multiplexer MUX1, a second multiplexer MUX2, a third multiplexer MUX3, and an output multiplexer MUX4.

For example, the test apparatus 100C may include a first multiplexer MUX1, a second multiplexer MUX2, and a third multiplexer MUX3, respectively connected in series to a plurality of elements 411, 412, and 413. In addition, the test apparatus 100C may include an output multiplexer MUX4 connected to the first multiplexer MUX1, the second multiplexer MUX2, and the third multiplexer MUX3.

In this case, each of the first multiplexer MUX1, the second multiplexer MUX2, and the third multiplexer MUX3 may have a 16×1 structure. For example, the output multiplexer MUX4 may have a 64×1 structure. However, the structure of each multiplexer is not limited to the above-described examples.

The test apparatus 100D may include a plurality of first elements 511 connected in series between the input terminal 102 and the first multiplexer MUX1. Each of the plurality of first elements 511 may be implemented as an inverter. For example, the plurality of first elements 511 may include first to sixteenth inverters I1 to 116.

In addition, the test apparatus 100D may include a plurality of second elements 512 connected in series between the input terminal 102 and the second multiplexer MUX2. Each of the plurality of second elements 512 may be implemented as a buffer. For example, the plurality of second elements 512 may include first to sixteenth buffers B1 to B16.

In addition, the test apparatus 100D may include a plurality of third elements 513 connected in series between the input terminal 102 and the third multiplexer MUX3. Each of the plurality of third elements 513 may be implemented as an AND gate. For example, the plurality of third elements 513 may include a first AND gate A1 to a sixteenth AND gate A16. In this case, the first AND gate A1 to the sixteenth AND gate A16 may be understood to correspond to the first AND gate A1 to the sixteenth AND gate A16 of FIG. 3.

For example, the test apparatus 100D may include a plurality of different types of elements 511, 512, or 513, respectively connected in series between the input terminal 102 and different multiplexers MUX1, MUX2, or MUX3.

According to an example implementation, the test apparatus 100D may include a plurality of different types of elements 511, 512, and 513 connected in series.

For example, each of the plurality of first elements 511 may be implemented as a buffer or an inverter. Each of the plurality of second elements 512 may be implemented as a buffer, an AND gate, or a NAND gate. Each of the plurality of third elements 513 may be implemented as an inverter, an AND gate, or an XOR gate.

However, the type and configuration of logic elements (or standard cells) constituting the plurality of elements 511, 512, and 513 are not limited to the above-described examples.

In this case, the plurality of elements 511, 512, and 513 may be understood as logic elements (or standard cells) implemented on an integrated circuit.

The first multiplexer MUX1 may be connected to a plurality of nodes ND1-1 to ND1-16 between the plurality of first elements 511. The second multiplexer MUX2 may be connected to a plurality of nodes ND2-1 to ND2-16 between the plurality of second elements 512. The third multiplexer MUX3 may be connected to a plurality of nodes ND3-1 to ND3-16 between the plurality of third elements 513.

The test apparatus 100D may further include a first select terminal 501 and a second select terminal 502 connected to the processor 110.

The processor 110 may transmit a first select signal SEL_CH to the output multiplexer MUX4 through a first select terminal 501.

Accordingly, the processor 110 may control the output multiplexer MUX4 to output data output from one of the first multiplexer MUX1, the second multiplexer MUX2, and the third multiplexer MUX3.

For example, the processor 110 may transmit the first select signal SEL_CH to the output multiplexer MUX4 through the first select terminal 501 to output data, output from the second multiplexer MUX2, as output data DO.

In addition, the processor 110 may transmit a second select signal SEL_ND to at least a portion of the first multiplexer MUX1, the second multiplexer MUX2, and the third multiplexer MUX3 through the second select terminal 502.

Accordingly, the processor 110 may control the first multiplexer MUX1, the second multiplexer MUX2, or the third multiplexer MUX3 to output at least a portion of a plurality of pieces of data output from a plurality of nodes connected to each multiplexer.

For example, the processor 110 may transmit the second select signal SEL_ND to the third multiplexer MUX3 through the second select terminal 502 to output data, transmitted from a 3-2-th node ND3-2 among a plurality of nodes ND3-1 to ND3-16 connected to the third multiplexer MUX3, as output data DO.

The processor 110 may control the first select terminal 501 and the second select terminal 502 to output a portion of a plurality of pieces of data, output from the plurality of elements 511, 512, and 513, as output data DO.

According to an example implementation, the processor 110 may control the first select terminal 501 and the second select terminal 502 to sequentially output a plurality of pieces of data output from the plurality of elements 511, 512, or 513.

For example, the processor 110 may control the first multiplexer MUX1 and the output multiplexer MUX4 through the first select terminal 501 and the second select terminal 502 to sequentially output a plurality of pieces of data output by the plurality of inverters I1 to 116, connected in series, based on the input data DI.

For example, the processor 110 may control the multiplexers MUX1, MUX2, MUX3, and MUX4 through the first select terminal 501 and the second select terminal 502 to sequentially output a plurality of pieces of data output by the first buffer B1 and the first AND gate A1 based on the input data DI.

According to an example implementation, the processor 110 may control the first select terminal 501 and the second select terminal 502 to output data, output from at least a portion of the plurality of elements 511, 512, or 513, as output data DO.

For example, the processor 110 may control the second multiplexer MUX2 and the output multiplexer MUX4 through the first select terminal 501 and the second select terminal 502 to respectively output a plurality of pieces of data output by the second buffer B2 and the fifteenth buffer B15 based on the input data DI.

For example, the processor 110 may control the second multiplexer MUX2, the third multiplexer MUX3, and the output multiplexer MUX4 through the first select terminal 501 and the second select terminal 502 to respectively output a plurality of pieces of data output by the fifteenth buffer B15 and the second AND gate A2 based on the input data DI.

For example, the processor 110 may control at least a portion of the first multiplexer MUX1, the second multiplexer MUX2, the third multiplexer MUX3, and the output multiplexer MUX4 to output at least a portion of a plurality of pieces of data output from the plurality of elements 511, 512, and 513.

Furthermore, the processor 110 may compare the output data DO, output from the output multiplexer MUX4, with a predetermined expected output value. The processor 110 may determine whether a defect has occurred in each of the plurality of devices 511, 512, and 513, based on a result of the comparison.

For example, when the expected output value set for the fifteenth buffer B15 is "0" and the fifteenth buffer B15 outputs "1," the processor 110 may determine that a defect has occurred in the fifteenth buffer B15.

Referring to the above-described configurations, the processor 110 may determine whether a defect has occurred in each of the plurality of elements 511, 512, and 513, based on the data output through a plurality of nodes, as the input data DI is input to the plurality of elements 511, 512, and 513 connected in series in an electrical path.

Accordingly, the test apparatus 100D may reduce the time consumed to identify an element in which a defect has occurred, among the plurality of elements 511, 512, and 513 connected in series in separate electrical paths on an integrated circuit.

FIG. 6 is a flowchart illustrating an example test method of determining whether each of a plurality of devices is defective. FIG. 7 is a flowchart illustrating an example operation of comparing an output data and an expected output value to identify an element in which a defect has occurred.

Referring to FIGS. 6 and 7 together, a processor 110 (or a test apparatus 100) according to an example implementation may determine whether a defect has occurred in each of a plurality of elements connected in series, based on a plurality of pieces of data input as input data DI is input to the plurality of elements.

The test apparatus and the processor of FIGS. 6 and 7 may be understood to correspond to the test apparatus 100 and processor 110 of FIG. 1, respectively.

In operation S10, the processor 110 may input input data DI to the plurality of elements connected in series.

For example, the processor 110 may input input data DI to a plurality of elements, connected in series, through an input terminal 102 connected to one of the plurality of elements.

For example, the processor 110 may input "0" to a plurality of elements, connected in series, through an input terminal 102 connected to an element disposed on one end, among the plurality of elements.

In this case, for example, each of the plurality of elements may be implemented as at least a portion of a flip-flop or a logic element (or a standard cell), but example implementations are not limited thereto.

In operation S30, the processor 110 may control a multiplexer MUX to output a plurality of pieces of data, output through a plurality of nodes between the plurality of elements, as output data DO.

For example, the processor 110 may output at least a portion of the plurality of pieces of data, output from the plurality of elements through a plurality of nodes connected to the plurality of elements, through a multiplexer MUX as the input data DI is input to the plurality of elements.

The multiplexer MUX may be connected to the plurality of elements through the plurality of nodes. The multiplexer MUX may be connected to the plurality of nodes between the plurality of elements. Accordingly, the multiplexer MUX may obtain data output from the plurality of elements through the plurality of nodes.

For example, the processor 110 may sequentially output at least a portion of the plurality of pieces of data, output from a plurality of flip-flops connected in series through a plurality of nodes, as "0" is input to the plurality of flip-flops.

For example, the processor 110 may output data, output from a specific logic element among a plurality of logic elements included in an integrated circuit, through a multiplexer MUX as "0" is input to the plurality of logic elements.

In operation S50, the processor 110 may determine whether a defect has occurred in each of the plurality of elements.

For example, the processor 110 may determine whether a defect has occurred in each of the plurality of elements, based on data output from the plurality of elements, as the input data DI is input to the plurality of elements.

Referring to FIG. 7, the processor 110 may compare the output data DO, output through the multiplexer MUX, with a predetermined expected output value to determine whether a defect has occurred in each of the plurality of elements.

In operation S40, the processor 110 may compare the output data DO, output through the multiplexer MUX, with the predetermined expected output value.

For example, the processor 110 may compare first data, output from the first flip-flop FF1, with a first expected output value set for the first flip-flop FF1 when the first data is output through the multiplexer MUX.

In operation S41, the processor 110 may identify an element in which a defect has occurred, among the plurality of elements, when the output data DO output through the multiplexer MUX is different from the predetermined expected output value.

For example, when the output data output through the multiplexer MUX is different from the predetermined expected output value, the processor 110 may determine that a defect has occurred in an element to which the output data DO is output.

For example, when the output data DO output from the first node N1 connected to the first flip-flop FF1 through the multiplexer MUX as "0" is input to a plurality of flip-flops, is "1" and an expected output value for the first flip-flop FF1 is "0," the processor 110 may determine that a defect has occurred in the first flip-flop FF1.

In operation S42, when the output data DO output through the multiplexer MUX is equal to the predetermined expected output value, the processor 110 may determine that an element outputting the output data DO is operating normally.

For example, when the output data DO output through the multiplexer MUX is equal to the predetermined expected output value, the processor 110 may determine that a defect has not occurred in the element outputting the output data DO.

For example, when a plurality of pieces of output data DO sequentially output from a plurality of inverters through a multiplexer MUX are equal to an expected output value preset for a plurality of inverters, the processor 110 may determine whether each of a plurality of inverters connected in series is operating normally.

Referring to the above-described configurations, the processor 110 may compare data, output through a plurality of nodes between a plurality of nodes, with a predetermined expected output value to determine whether a defect has occurred in each of the plurality of elements.

Accordingly, the test apparatus 100 may reduce the time consumed to identify an element in which a defect has occurred, among a plurality of elements included in an integrated circuit.

As described above, the test apparatus may determine whether a defect has occurred in each of a plurality of elements included in an integrated circuit, based on data output in response to input data DI.

Accordingly, the test apparatus 100 may reduce the time consumed to identity an element in which a defect has occurred, among a plurality of elements included in an integrated circuit.

In addition, the test apparatus 100 may determine whether a defect has occurred in an internal path included in each of the plurality of elements, based on data output through a plurality of nodes as input data DI is input the plurality of elements.

Accordingly, the test apparatus 100 may reduce the time consumed to identify an internal path in which a defect has occurred, among a plurality of internal paths included in the element determined to be an element in which a defect has occurred.

As set forth above, a test apparatus s may identify an element in which a defect has occurred, among a plurality of elements, based on data output between the plurality of elements as input data is input.

As a result, the test apparatus may reduce the time required to identify an element in which a defect has occurred during a process, among a plurality of elements included in an integrated circuit.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While example implementations have been shown and described above, it will be apparent to those skilled in the art that modifications and variations could be made without departing from the scope of the present inventive concept as defined by the appended claims.

What is claimed is:

1. A test apparatus comprising:
   an input terminal;
   a first multiplexer;
   a plurality of first elements connected in series between the input terminal and the first multiplexer, the first multiplexer being connected to each node of a plurality of nodes among the plurality of first elements; and
   a processor connected to the input terminal and the first multiplexer,
   wherein
   the processor is configured to:
      provide input data to the plurality of first elements through the input terminal;
      obtain output data from the first multiplexer, wherein the output data is based on node data being passed from the plurality of nodes to the first multiplexer as the input data is provided; and
      determine whether a defect has occurred in one or more of the plurality of first elements by comparing the output data from the first multiplexer with one or more expected output values.

2. The test apparatus of claim 1, wherein
   the processor is configured to:
      cause first data, from a first node between a 1-1-th element and a 1-2-th element connected to the 1-1-th element, to pass to the first multiplexer as the input data; and
      determine that a defect has occurred in the 1-1-th element, when the first data is different from a first expected output value.

3. The test apparatus of claim 2, wherein
   the processor is configured to:
      cause second data, from a second node between the 1-2-th element and a 1-3-th element connected to the 1-2-th element, to pass to the first multiplexer; and
      determine that a defect has occurred in the 1-1-th element adjacent to the input terminal, when the first data is different from the first expected output value and the second data is different from a second expected output value.

4. The test apparatus of claim 1, wherein
   the processor is configured to obtain the output data after a predetermined time has elapsed since the input data was provided to the plurality of first elements.

5. The test apparatus of claim 4, wherein
   each first element of the plurality of first elements comprises flip-flop circuitry,
   the test apparatus comprises a clock generator connected to each first element of the plurality of first elements, and
   the processor is configured to provide a clock signal to each first element of the plurality of first elements through the clock generator for the predetermined time.

6. The test apparatus of claim 1, wherein
   each first element of the plurality of first elements comprises at least a first internal path and a second internal path, and
   the input data is transmitted to the first multiplexer through internal paths in each first element of the plurality of first elements, among the at least first internal path and the second internal path included in each of the plurality of first elements.

7. The test apparatus of claim 6, wherein
   each first element of the plurality of first elements comprises an AND gate and comprises at least a first input port connected to the first internal path and a second input port connected to a second internal path, and
   the processor is configured to provide a predetermined reference value through the first or the second input port whichever is not included in an electrical path connecting the input terminal to the first multiplexer.

8. The test apparatus of claim 1, further comprising
   a plurality of second elements connected in series between the input terminal and a second multiplexer, wherein
   each node of a plurality of nodes among the plurality of second elements is connected to the second multiplexer, and
   the processor is configured to:
      provide the input data to the plurality of second elements through the input terminal;
      obtain additional output data from the second multiplexer, wherein the additional output data is based on node data being passed from the plurality of nodes among the plurality of second elements to the second multiplexer as the input data is provided; and
      compare the additional output data from the second multiplexer, with a second expected output value to determine whether a defect has occurred in each of the plurality of second elements.

9. The test apparatus of claim 8, wherein
   each first element of the plurality of first elements is implemented as a first type of element, and
   each second element of the plurality of second elements is implemented as a second type of element, the second type of element being different from the first type of element.

10. The test apparatus of claim 8, further comprising:
    an output multiplexer connected to the first multiplexer and to the second multiplexer,
    wherein
    the processor is configured to control the output multiplexer to select either the first multiplexer or the second multiplexer.

11. A test method of detecting defects of elements included in an integrated circuit, the test method comprising:
    providing input data to a plurality of elements, connected in series in the integrated circuit, through an input terminal;
    obtaining, as output data, at least a portion of a plurality of pieces of data that are output from a plurality of nodes among the plurality of elements as the input data is provided, from a multiplexer; and
    determining whether a defect has occurred in each element of the plurality of elements by comparing the output data with an expected output value,
    wherein inputs to the multiplexer are connected to the plurality of nodes among the plurality of elements or between a final element and the multiplexer.

12. The test method of claim 11, wherein
comparing the output data with the expected output value comprises determining that a defect has occurred in a first element, when a first data output from a first node between the first element and a second element is different from a first expected output value.

13. The test method of claim 11, wherein
obtaining the output data comprises obtaining the output data from the multiplexer after a predetermined time has elapsed since the input data was provided to the plurality of elements.

14. The test method of claim 13, wherein
each element of the plurality of elements comprises flip-flop circuitry, and
the test method comprises providing a clock signal to the plurality of elements through a clock generator connected to each of the plurality of elements for the predetermined time.

15. The test method of claim 11, wherein
determining whether the defect has occurred in each of the plurality of elements comprises determining that a defect has occurred in an element adjacent to the input terminal, among two or more continuous elements of the plurality of elements connected in series, when each of a plurality of pieces of data output from the two or more continuous elements is different from the expected output value.

16. The test method of claim 11, wherein
each element of the plurality of elements comprises at least a first internal path connected with a first input port and at least a second internal path connected with a second input port, and
providing the input data comprises:
    providing the input data through input ports included in an electrical path connecting the input terminal to the multiplexer; and
    providing a predetermined reference value through input ports which are not included in the electrical path.

17. A system-on-chip comprising:
an integrated circuit comprising a plurality of elements connected in series;
an input terminal having one end connected to the plurality of elements;
a multiplexer having an input end connected to a plurality of nodes among the plurality of elements; and
a processor connected to the input terminal and the multiplexer,
wherein the processor is configured to:
    provide input data to the plurality of elements through the input terminal;
    obtain, as output data, at least a portion of a plurality of pieces of data that are output from the plurality of nodes as the input data is provided, from the multiplexer; and
    determine whether a defect has occurred in each element of the plurality of elements by comparing the output data with an expected output value.

18. The system-on-chip of claim 17, wherein
the processor is configured to:
    obtain first data, output from a first node between a first element and a second element that is connected to the first element as the input data is provided, from the multiplexer; and
    determine that a defect has occurred in the first element, when the first data is different from a first expected output value.

19. The system-on-chip of claim 18, wherein
the processor is configured to determine that a defect has occurred in an element adjacent to the input terminal, among two or more continuous elements of the plurality of elements connected in series, when each of a plurality of pieces of data output from the two or more continuous elements is different from the expected output value.

20. The system-on-chip of claim 17, wherein
each element of the plurality of elements comprises flip-flop circuity,
the system-on-chip further comprises a clock generator connected to each element of the plurality of elements, and
the processor is configured to:
    provide a clock signal to the plurality of elements through the clock generator for a predetermined time after the input data was provided; and
    obtain at least a portion of a plurality of pieces of data, output from the plurality of nodes, from the multiplexer after the predetermined time has elapsed since the input data was provided.

* * * * *